(12) United States Patent
Foster et al.

(10) Patent No.: US 8,343,791 B2
(45) Date of Patent: Jan. 1, 2013

(54) PLATING PROCESS AND APPARATUS FOR THROUGH WAFER FEATURES

(75) Inventors: John S. Foster, Santa Barbara, CA (US); John C. Harley, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 25 days.

(21) Appl. No.: 12/923,693

(22) Filed: Oct. 5, 2010

(65) Prior Publication Data

US 2012/0080762 A1 Apr. 5, 2012

(51) Int. Cl.
*H01L 21/00* (2006.01)
(52) U.S. Cl. .... 438/51; 438/456; 438/667; 257/E21.586
(58) Field of Classification Search .................... 438/51, 438/456, 977
See application file for complete search history.

(56) References Cited

U.S. PATENT DOCUMENTS 6,812,055 B2 * 11/2004 Tamura et al. .................. 438/48

* cited by examiner

*Primary Examiner* — Chandra Chaudhari
(74) *Attorney, Agent, or Firm* — Jaquelin K. Spong (57) ABSTRACT

A method for forming through features in a substrate uses a seed layer deposited over a first substrate, and a second substrate bonded to the seed layer. The features may be formed in the first substrate, by plating a conductive filler material onto the seed layer. The first substrate and the second substrate may then be bonded to a third substrate, and the second substrate is removed, leaving through features and first substrate adhered to the third substrate. The through features may provide at least one of electrical access and motion to a plurality of devices formed on the third substrate, or may impart movement to a moveable feature on the first substrate, wherein the third substrate supports the first substrate after removal of the second substrate.

13 Claims, 8 Drawing Sheets

PLATING PROCESS AND APPARATUS FOR THROUGH WAFER FEATURES

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a process for plating through wafer features having high aspect ratios.

One example of a through substrate features is a via that extends through the thickness of a substrate, providing electrical continuity from a pad on one side to a circuit on the other. For example, electrical vias may allow electrical access to electronic devices or microelectromechanical systems (MEMS) within a package or in a circuit. In order to continually reduce the cost of such packages and circuits, the packing density of devices within the packages and circuits on a wafer has been continually increased. In order to support the increase in packing density, the pitch between electrical vias for the devices has also continued to shrink. As a consequence, there is a desire to form vias of increasingly large aspect ratio, that is, the vias are tending to become increasingly long and narrow.

Figure 1:
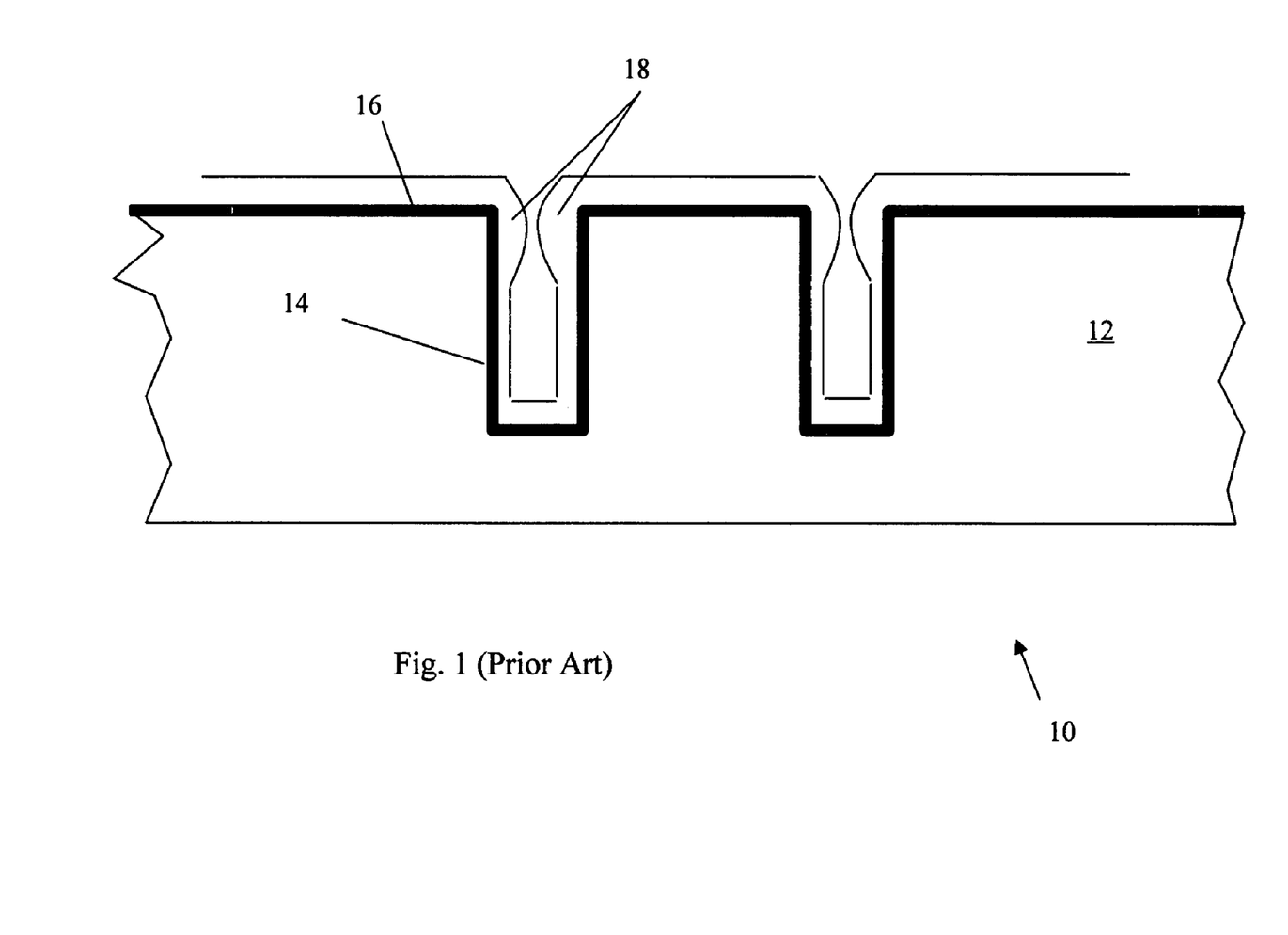
FIG. 1 is a cross sectional view showing a prior art approach to the formation of a plated via.

Long, narrow vias are often created by plating a conductive material into a blind hole formed in a substrate. FIG. 1 illustrates a typical prior art process for forming an electrical via by electroplating. A hole 14 is created in a substrate 12 by a directional material removal process such as reactive ion etching (RIE). A seed layer 16 is then deposited conformally over the etched surface, to provide a conductive seed layer to attract the plating material from the plating bath. The hole may then be filled by plating onto the seed layer with a conductive material. Subsequently, the blind end wall of the hole may be removed by etching, sawing or grinding, for example, which may create a via that extends through the thickness of the substrate.

Another known method for making vias is to use an anisotropic etch to form the holes with sloping sidewalls, and to deposit the conductive seed layer material on the sloped walls of the holes. However, this method often results in conductive seed layer material having non-uniform thickness, and the heat conduction in the thin deposited layer is relatively poor. The aspect ratio must also remain near 1:2 (width=2×depth), further limiting the density of the vias. In either case, the deposited layer may be used as a seed layer for the deposition of the conductive filler material by electrochemical plating deposition onto the seed layer. Then, as before, the blind end wall of the hole may be removed to create a via that extends through the substrate.

SUMMARY

However, when using the approach illustrated schematically in FIG. 1, the plated material has a tendency to concentrate at the corners 18 of the blind hole 14. This tendency results from the proportionately larger density of field lines emanating from the corners, and from geometric considerations, that is, the aspect ratio of the via. Since the via is generally deeper than it is wide, the build up of material in the cylinder of the via will close off the cylinder before the plated material reaches the top of the substrate and completely fills the hole. As the aperture to the via has become closed, the plating bath no longer circulates and the confined bath within the hole is exhausted of its plating species. Plating into the hole will then cease, and a void is formed beneath the point of closure of the via aperture. Since these problems worsen as the via becomes longer and narrower, the approach illustrated in FIG. 1 becomes increasingly difficult for long, narrow vias. Specialized bath chemistries have been developed that reduce the negative effects cited above, but they can be expensive and are difficult to control.

For the same reason, it is particularly difficult to plate alloy materials into deep, narrow holes, as the plating bath may become exhausted of one of the alloy components before the other, leading to variation of the alloy ratio along the depth of the hole or feature. The method described here may improve the consistency of the alloy ratio throughout the depth of the feature. The method may be used to create features other than vias, such as, for example, inlaid materials in a moving actuator. Such inlaid materials and exemplary devices are described in greater detail in U.S. patent application Ser. No. 7,622,783, issued Nov. 4, 2009 and assigned to the same assignee as the present application.

Systems and methods are described here which address the above-mentioned problem, and are particularly applicable to the formation of deep, narrow features by plating. The systems and methods create a seed layer only at the bottom of the hole, rather than at the bottom and on the side walls. Since the seed layer only exists at the bottom of the hole, the plating material may necessarily deposit first at the bottom of the blind hole, and proceed upwards. As the plating proceeds, the hole may be filled uniformly from the bottom to the top, and few or no voids are formed. The vias formed using these methods may be solid metal, so that the heat and signal conduction through the vias may be excellent. If plating an alloy, the free circulation of the plating bath within the hole, because the opening is not constricted, may lead to more consistent, more uniform alloy properties in the inlaid feature.

In one exemplary embodiment, the conductive seed layer may be formed by depositing a conductive layer over a first substrate, and then fusion bonding a second substrate material onto the conductive seed layer to form a two-wafer assembly. After bonding to the second substrate, the first substrate may be thinned to a desired target thickness. The first substrate may then be processed to form the blind holes through the depth of the first substrate, at which point the conductive seed layer at the bottom of the hole is exposed. The filler material is then plated into the hole onto the seed layer, from the bottom up. After plating with the filler material, the wafer may be planarized, so that the tops of the features are flush with the top surface and the features, for example vias, are electrically isolated from one another. Finally, the second substrate may be removed, to form the through wafer feature through the thickness of the first substrate. The layers may be ground or chemically etched to remove them.

In other exemplary embodiments, the conductive seed layer may first be patterned to create additional features in the seed layer which are useful for various purposes downstream in the process. The patterned seed layer is then covered with the second substrate material. The through wafer features are then formed and plated in the first substrate as before, to fill the feature with an inlaid material. To make the through wafer features, the second wafer may be ground or chemically etched to remove the second substrate leaving the conductive through wafer features extending through the first substrate. The seed layer may also be removed at this point, of not required for other purposes.

It should be understood that these through wafer features may serve purposes other than electrical access (i.e. features other than vias), and that the the inlaid (plated) metal material may have a variety of uses. Furthermore, it should be understood that further additional features may be formed which are not filled with inlaid conductive material, in the thinned first substrate. For example, movable features that will be actuated by the inlaid metal material may be formed in the thinned substrate before or after the inlaid materials.

Prior to removing the second substrate and, optionally, the seed layer from the wafer assembly, the wafer assembly may be bonded to a a third wafer. This third wafer may have active device formed thereon, to which the inlaid metal features allow electrical access, i.e. the inlaid features are electrical vias. Since the device wafer now also provides the needed mechanical support, the second substrate may be removed, leaving the first wafer and the through wafer vias.

As mentioned above, this method and apparatus described herein may be used to form inlaid features other than through wafer vias. In these other applications, the inlaid material is not necessarily a material chosen for its conductivity but for its other attributes, such as magnetic properties. Nickel-iron alloys, such as Permalloy (~78.5% Ni, 21.5% Fe) and Nicalloy (~47% Ni, 53% Iron), and Permendur (~50 Cobalt, 50% Iron) are commonly used magnetic materials used in data storage devices, electromagnetic motors and actuators. However, controlling alloy ratios, for example in NiFe (47%/53%) is far harder in a deep plating application than on a surface plating application. This method may be used to create inlaid features using the above, and other, alloys, wherein the composition of the alloy is relatively consistent throughout the depth of the feature.

Systems and methods will be described particularly with attention paid to the formation and patterning of the thinned feature wafer. The remaining process steps needed to form the completed through wafer feature will also be described.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The following description is directed primarily to the formation of electrical vias which extend through the thickness of a wafer substrate. However, as mentioned above, it should be understood that this method may also be used to create other sorts of features, such as inlaid permalloy or metal portions of a movable actuator, for example. To form the inlaid metal feature, the same steps would be performed, but the inlaid, plated material may be, for example, NiFe, CoFe, various solders, or nickel, rather than copper.

The systems and methods described herein may be particularly applicable to microelectromechanical devices, wherein vias may be required to carry a relatively large amount of current. MEMS devices are often fabricated on a composite silicon-on-insulator wafer, consisting of a relatively thick (about 675 µm) "handle" layer of silicon overcoated with a thin (about 1 µm) layer of silicon dioxide, and covered with a silicon "device" layer (about 5 µm thick, for example). The MEMS device is made by forming moveable features in the device layer by, for example, deep reactive ion etching (DRIE) with the silicon dioxide layer forming a convenient etch stop. The movable feature is then freed by, for example, wet etching the silicon dioxide layer from beneath the moveable feature. The moveable features may then be hermetically encapsulated in a cap or lid wafer, which is bonded or otherwise adhered to the top of the silicon device layer, to protect the moveable features from damage from handling and/or to seal a particular gas in the device as a preferred environment for operation of the MEMS device. In order to provide electrical access to the MEMS device, the SOI wafer may be bonded to another substrate having electrical circuitry and/or through-substrate vias (TSVs). As used herein, the term "through substrate via" is used synonymously with "through wafer via."

Through-substrate vias are particularly convenient for encapsulated MEMS devices, because they may allow electrical access to the encapsulated devices, without increasing the wafer area consumed by the devices. They may also deliver the relatively large amounts of current that may be required by the MEMS devices. Without such through holes, electrical access to the MEMS device may have to be gained by electrical leads routed under the capping wafer which is then hermetically sealed to the device wafer. It may be problematic, however, to achieve a hermetic seal over terrain that includes the electrical leads unless more complex and expensive processing steps are employed. This approach also makes radio-frequency applications of the device limited when metallic bondlines are used, as electromagnetic coupling will occur from the metallic bondline residing over the laterally oriented leads. Alternatively, the electrical access may be achieved with through-wafer vias formed through a via wafer, using the systems and methods described here.

The process described below may be useful for making such through wafer vias, or other through wafer or through substrate features. The through-wafer features may be constructed by first forming a seed layer over a first wafer (the "feature substrate" or "feature wafer"), and bonding a second support wafer to the seed layer. This combination of the feature wafer, the support wafer, and the seed layer is referred to as a "wafer assembly." The feature wafer at this point may be thinned to a desired thickness, and subsequently a plurality of blind holes may be formed in the feature wafer, to the depth of the seed layer. It should be understood that although the word "blind hole" is used, the term should be construed as including any shape of opening, including a circular hole or non-circular trench, which does not extend completely through a given thickness. In addition, the term "seed layer" should be understood to mean a conductive layer which functions as a terminal for the plating process, such that material from a plating bath is electrochemically deposited on the seed layer. A "through wafer feature" or through-substrate feature" should be understood to mean an void or conduit which extends completely through the material of the substrate, and may be filled with a material inlaid into the void or conduit. Accordingly, a "blind hole extending to the seed layer" should be understood to mean an opening formed in the top surface of the substrate and extending into the substrate up to the seed layer.

It should also be understood that the designation of "first" and "second" substrate is arbitrary, and that the blind holes and features may be formed either in the original ("first") substrate or the subsequent ("second") substrate. In either case, this feature substrate is the structure with the plurality of features and blind holes that may be joined to a device layer as described below, while the other substrate without the features and blind holes is removed, and is used primarily to support the feature wafer. The wafer with features will be referred to as the "feature substrate" or "feature wafer" and the substrate which provides support is referred to as the "support substrate" or "support wafer."

After bonding to the support wafer and forming the blind holes, the blind holes may then be plated with a conductive filler material to create the inlaid features in the feature substrate. The feature substrate may then be planarized using, for example, chemical mechanical polishing. The wafer assembly may then be bonded to another device wafer containing MEMS or other devices, wherein the features in the feature wafer may provide electrical access to the MEMS or other devices. Upon bonding to the device wafer, the support wafer may be removed from the wafer assembly.

Alternatively, the feature substrate may be used as a substrate directly for the fabrication of the MEMS or other devices directly thereon, using for example, surface machining techniques to fabricate the device over the features on the feature substrate, or to etch additional elements such as movable elements in to the feature substrate. However, because of the large number of steps involved, such an approach may become prohibitively expensive for volume manufacturing.

An exemplary process will now be described for performing the method, with reference to FIGS. 2-12. Alternative embodiments will be described with respect to FIGS. 13-15.

Figure 2:
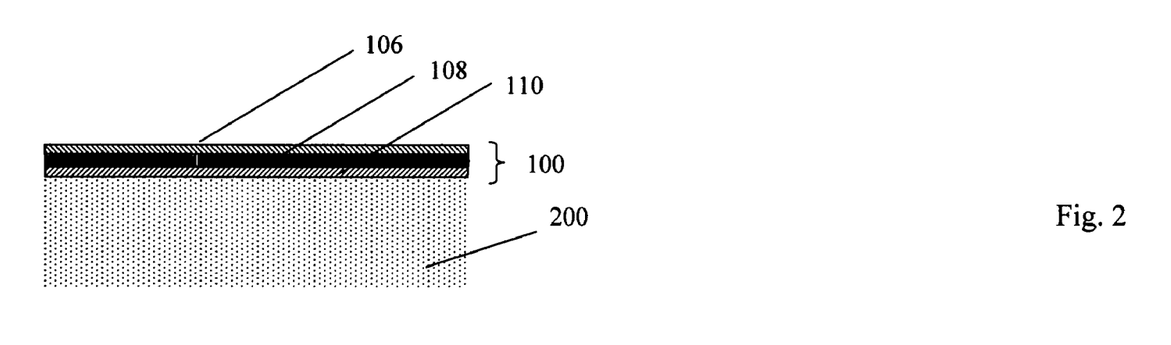
FIG. 2 is a cross sectional view of an exemplary substrate after a first step of fabrication.

FIG. 2 is a cross sectional view of an exemplary substrate 200 after a first step in the fabrication of the plated through wafer feature. The substrate 200 may be, for example, silicon, low-doped or float zone silicon, glass or any of a number of other common substrate materials. The substrate resistivity should be high enough to provide electrical isolation between the features which will be formed therein if they are to function as electrical vias, but low enough to conduct small amounts of DC current. This current capability may be useful because the substrate may serve as an electrode in the plating process used to fill the features with conductive material. Thus, the specific attributes of the substrate 200 will be chosen with the application requirements in mind, such as signal frequency, feature dimensions and processing time. In one exemplary embodiment, the substrate 200 is a 500 um thick double side polished (DSP) low resistivity silicon wafer, having a resistivity of less than about 10 ohm-cm.

The substrate 200 may first be coated with an adhesion layer 110, which may be, for example, titanium (Ti) or titanium-tungsten (TiW). The thickness of the adhesion layer may be, for example, about 30 nm. In one embodiment, the adhesion layer 110 may be TiW which is sputter-deposited, or CVD deposited on a silicon wafer 200. The purpose of the adhesion layer 110 may be to promote good adhesion between the seed layer (to follow) to the substrate 200.

A seed layer 120 may then be deposited over the adhesion layer 110 by, for example, sputter deposition. In one embodiment, the seed layer 120 is a copper (Cu) layer. It may be helpful to deposit the seed layer 120 to a thickness adequate to assure low resistivity. Other seed layer materials may be used which have a resistivity of no more than about 1-20 ohms/square, and other good conductors such as gold (Au) may be used. This low resistivity is used to enable the plating to occur on this layer, as it serves as one electrode or terminal for the plating process.

While a Cu seed layer is described here, it should be understood that the seed layer may be composed of any of a number of other materials, which are effective for adhesion and plating of the conductive material into the blind hole, including chromium/gold (Cr/Au), titanium (Ti), and nickel (Ni) The Cu seed layer 120 may be deposited by, for example, chemical vapor deposition (CVD), evaporation or sputtering. The seed layer 120 may be deposited to a thicknesses of at least about 100 nm up to one micron or more, so long as reasonably low resistance conductive path is made to the bottom of the features. In one exemplary embodiment, the seed layer is a 500 nm thick layer of Cu, sputter deposited over the adhesion layer 110.

Another layer 130 is then deposited over seed layer 120. The purpose of layer 130 is to enable bonding to a second substrate, which will function as a handle wafer for the assembly. That is, the second substrate 300 will be used primarily to provide mechanical support to the wafer assembly, as will be described below. This bonding layer 130 may be, for example, a dielectric or glassy material such as borosilicate or silicon dioxide, $SiO_2$. The glassy bonding layer 130 may allow bonding, such as anodic bonding, to a silicon second substrate. The bonding layer 130 may be, for example, about 50 nm thick.

Figure 3:
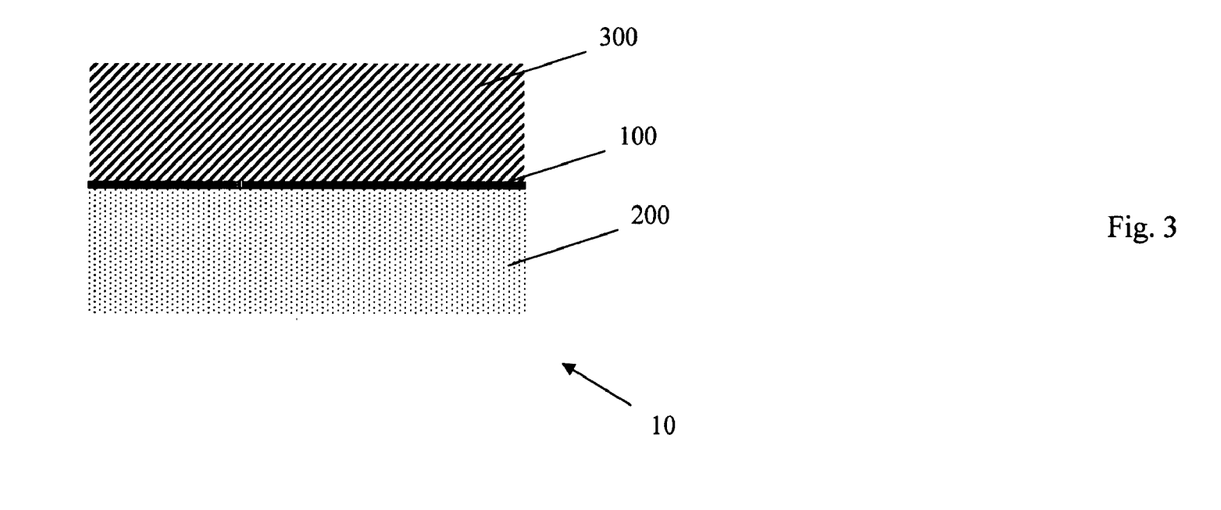
FIG. 3 is a cross sectional view of the exemplary substrate after a second step of fabrication.

FIG. 3 is a cross sectional view of the exemplary wafer assembly 10 after a second step of fabrication of the through wafer feature. In FIG. 3, a second substrate layer 300 may be bonded to the bonding layer 130. For example, the second substrate layer 300 may be low resistivity silicon (Si), which may be doped to a resistance level of less that about 100 ohms/square. As mentioned above, this second substrate layer 300 may be primarily a handle wafer, that is, a layer having sufficient mechanical integrity to support the feature substrate 200, after that feature substrate is thinned later in processing. Accordingly, the second substrate 300 may be any material having sufficient mechanical integrity, such as glass or ceramic. The substrate layer 300, if Si, may be anodically bonded to the $SiO_2$ bonding layer 130, using techniques well known in the art. The surfaces may be bonded at elevated temperature, for example, about 400 degrees centigrade, by applying a large voltage potential between the surfaces. In one exemplary embodiment, a voltage potential of about 1 kV is applied between the surfaces 130 and 300. It may be helpful or necessary to clean the surfaces prior to bonding by applying a solvent, an agitation or a plasma to the respective surfaces. The bonding may take place in air or vacuum, depending on the material requirements, and a pressure of about 1 atm may be applied between the surfaces to accomplish the bond. The combination of the first wafer 200 and second wafer 300 will henceforth be referred to as the wafer assembly or substrate assembly 10 as the other steps of the exemplary process are described.

It should be understood the $SiO_2$ bonding layer 130 and low resistivity silicon second substrate 300 material choices are exemplary only. The bonding layer 130 may be any of a number of other adhesive substances, such as cement, glue, epoxy, metal or the like, which is capable of adhering the seed layer to the second substrate. For example, if the second substrate is glass or ceramic, and epoxy bonding layer 130 may be used.

Figure 4:
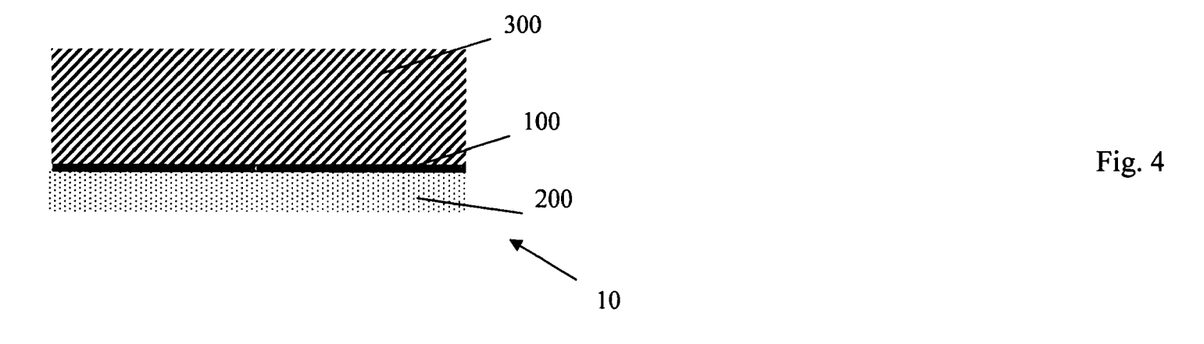
FIG. 4 is a cross sectional view of the exemplary substrate during a third step of fabrication.

FIG. 4 is a cross sectional view of the device after a third step of fabrication of the through substrate features. In FIG. 4, the feature substrate 200 is thinned to a desired thickness, wherein this thickness may determine the ultimate depth of the features, and may depend on the application. In one exemplary embodiment, the final thickness is about 50 and is achieved by, for example, grinding material from the backside of the wafer stack assembly, followed by chemical-mechanical polishing (CMP). Since the wafer assembly is mechanically supported at this point by the second substrate 300, a relatively thin layer of the first feature substrate 200 may remain after thinning.

Figure 5:
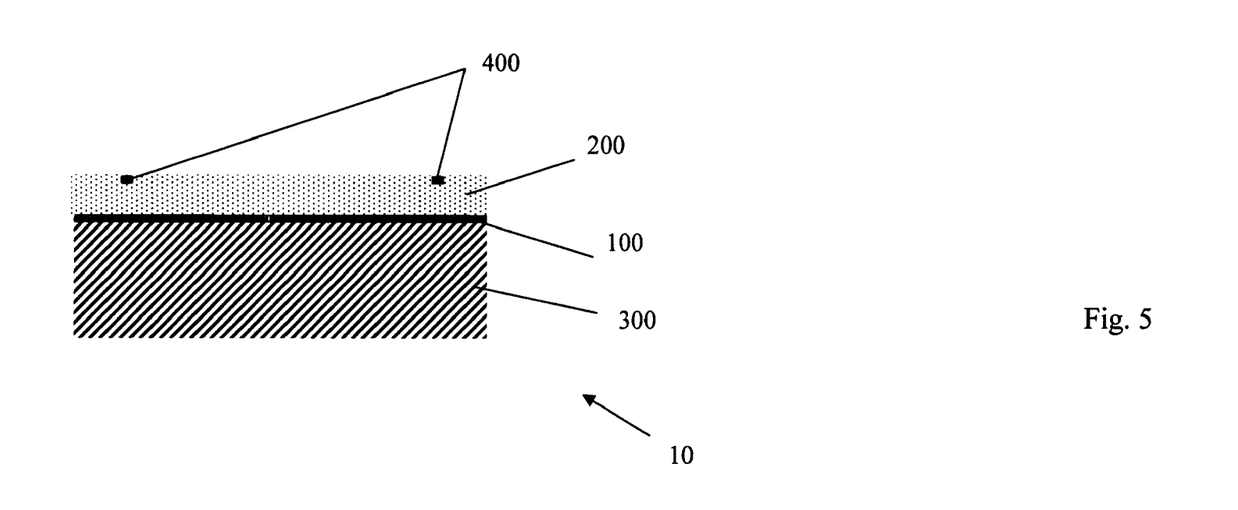
FIG. 5 is a cross sectional view of the exemplary substrate after the third step of fabrication.

In a fourth step shown in FIG. 5, the wafer assembly is flipped over, so that processing can begin on the formation of the through wafer features in the thinned feature substrate 200. A set of alignment marks 400 may be deposited on the thinned substrate 200 by, for example, sputter deposition. The exact dimensions and materials of the targets or alignment marks will depend on the application. These marks may be used to align subsequent masks properly, so that subsequent features are located properly with respect to previous features.

Figure 6:
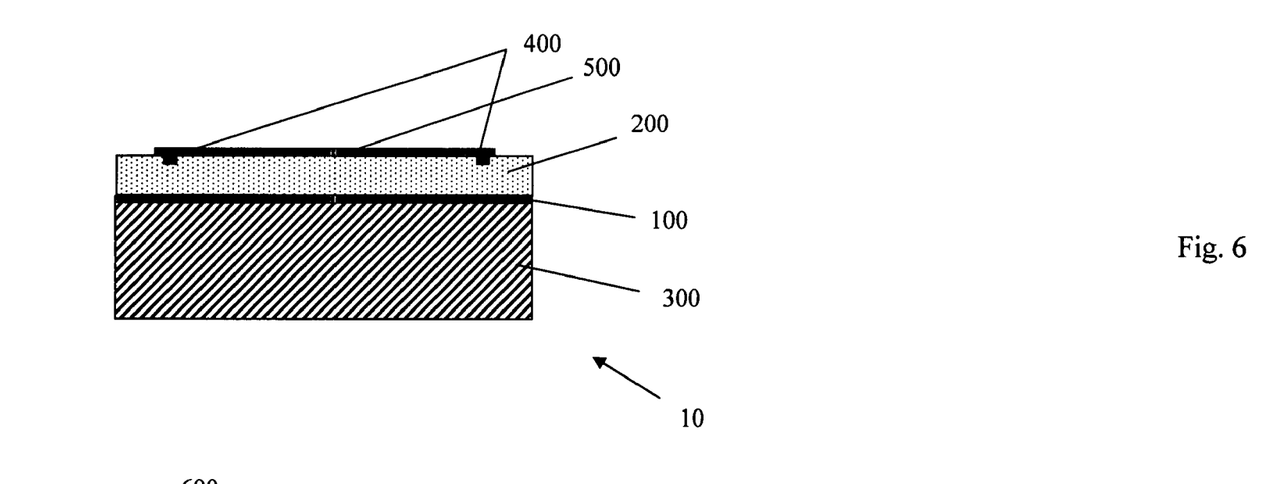
FIG. 6 is a cross sectional view of the exemplary substrate after a fourth step of fabrication.

In the fifth step of the process, shown in FIG. 6, a hard masking or photoresist material 500 may be deposited over the thinned substrate 200 and alignment marks 400. The hard mask may be, for example, a silicon oxide which may be deposited to a thickness of about 40 nm. The hard mask 500 may be deposited using CVC sputter deposition, for example. The deposited oxide layer may have a lateral extent sufficient to cover the targets or alignment marks 400, but may not extend to the edge of the wafer. This may be advantageous, because as will be described below, the plating bath electrodes may be preferentially located at the edges of the thinned feature substrate 200.

Figure 7:
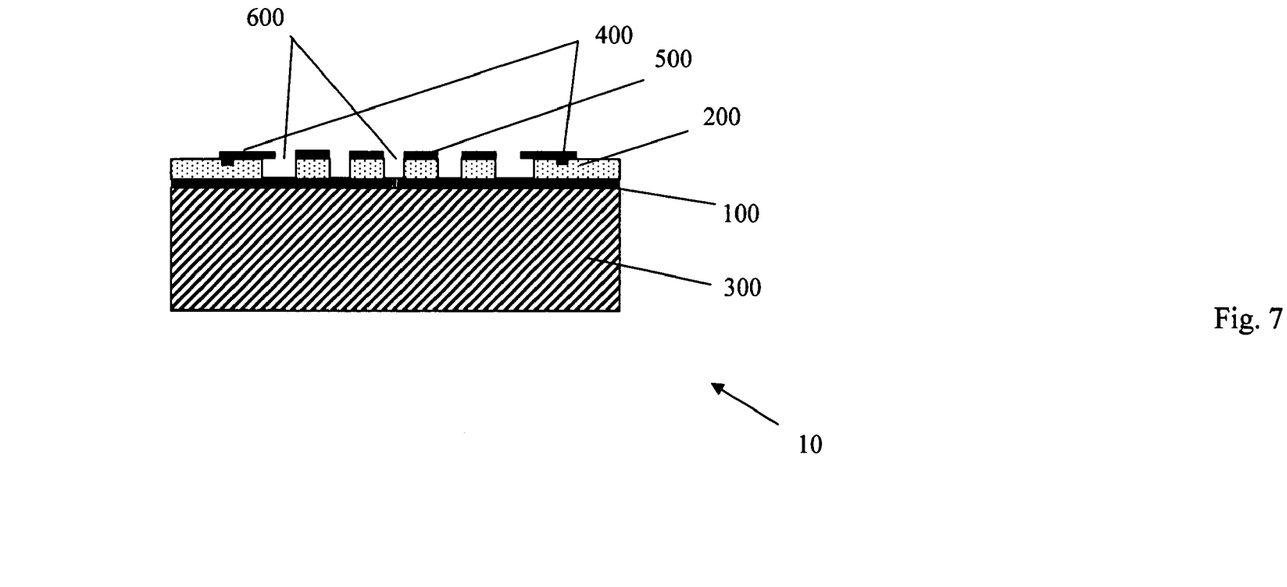
FIG. 7 is a cross sectional view of the exemplary substrate after a fifth step of fabrication.

FIG. 7 shows a sixth step of the exemplary process in cross section. As shown in FIG. 7, lands and spaces may be formed in the hard mask layer 500, which will define the locations and widths of the features. After formation of the lands and spaces, the features may be etched in the thinned substrate 200 by, for example, reactive ion etching. Suitable dimensions for the features may be 50 μm in depth, and 15 μm in width. However, these exemplary dimensions are examplary, and will depend on the requirements of the application. In fact, features of very high aspect ratio (depth to width) may be formed using this process, because plating into the feature necessarily takes place from the bottom of the feature to the top, so that the pinching effect illustrated in FIG. 1 is avoided.

Figure 8:
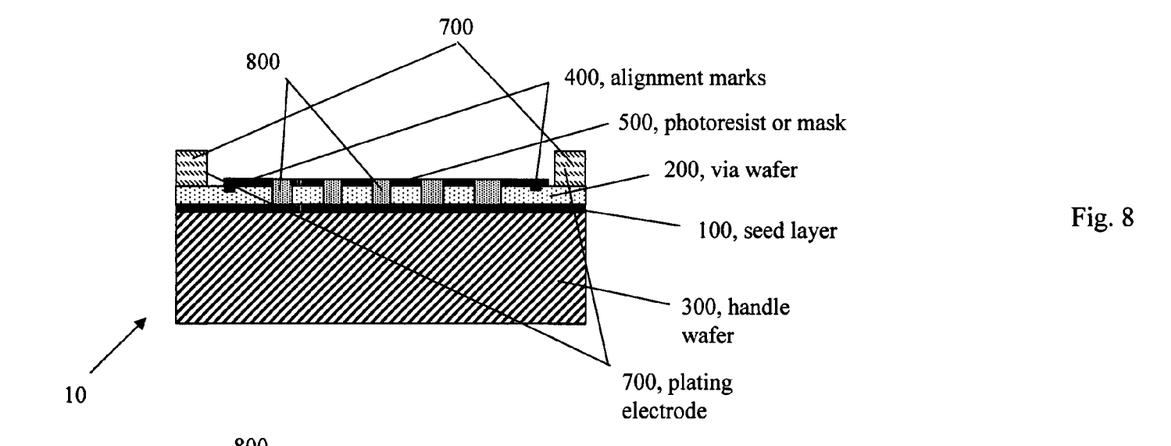
FIG. 8 is a cross sectional view of the exemplary substrate after a sixth step of fabrication.

In FIG. 8, the wafer assembly as previously prepared is provided with a set of plating electrodes 700, and immersed in a plating bath. The plating electrodes 700 may be located at the edge of the thinned feature wafer 200. Therefore, the current path during the plating may be from the bath to the seed layer 120, laterally along the seed layer 120 to the outer edges of the wafer assembly, and then for a short distance through the thickness of the feature substrate 200 to the plating electrodes 700. Since the current may travel a short distance through the feature substrate, it is important in this embodiment that the feature substrate have a finite conductivity. However, since the path length through the feature substrate is short, this conductivity need not be large, and may not interfere with the electrical isolation between the features, especially if the signals carried by the features are relatively high frequency compared to the DC plating current.

Other techniques may be used to provide the current return path to the plating system, other than the plating electrodes 700, For example, one may paint a portion of the top wafer and the sidewall of the wafer with silver epoxy, or other conductive compound. In another embodiment, an electrical connection may be made from a top electrode down to the bottom seed layer, without having to send current through the thinned feature wafer 200. Another embodiment makes contact to the seed layer by grinding off the outer portion of the thinned feature wafer 200, and then depositing a new seed layer at that outer edge, or applying silver epoxy as in the previous example. One could also form the metal of the seed layer to wrap around the edge of the wafer, and then simply make electrical contact to the edge of the wafer rather than the top. It should be understood that these alternative embodiments, as well as others, are also contemplated and covered under the claims which follow.

Plating may proceed using a regular, direct current (DC) plating protocol, or a pulsed or reverse-pulse plating protocol. Combination forward and reverse pulse plating processes, can be done with standard bath chemistries using wide process windows as is known in the art. Using the seed layer method described herein, no expensive additives are required in plating baths to plate high aspect ratio features and an essentially perfect fill.

The plated species may be copper (Cu), for example, plated by immersing the thinned substrate 200 and electrodes 700 in a plating solution containing copper sulfate and sulfuric acid and performing the plating process. However, it should be understood that this embodiment is exemplary only, and that any other suitably conductive material which can be plated on the substrate, including gold (Au) or nickel (Ni), may be used in place of copper. One particularly important application may be the plating of NiFe and CoFe alloys such as Permalloy (~78.5% Ni, 21.5% Fe) and Nicalloy (~47% Ni, 53% Iron), and Permendur (~50 Cobalt, 50% Iron). This method may greatly improve the control of alloy composition in deep holes, which are otherwise difficult to control using the prior art methods.

Figure 9:
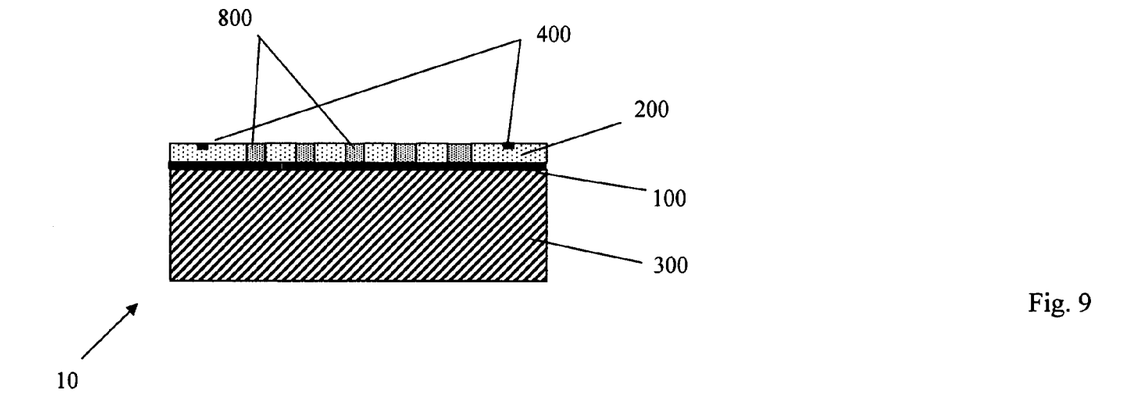
FIG. 9 is a cross sectional view of the exemplary substrate after a seventh step of fabrication.

Upon completion of the plating, the features 800 are filled with the conductive material. The top surface of the wafer assembly may then be planarized using, for example, chemical/mechanical planarization (CMP), which is well known in the art. The CMP may remove the excess filler material plated over the top of the substrate, as well as the mask material 500 from the top of the substrate. FIG. 9 shows the condition of the wafer assembly 10 after CMP.

Figure 10:
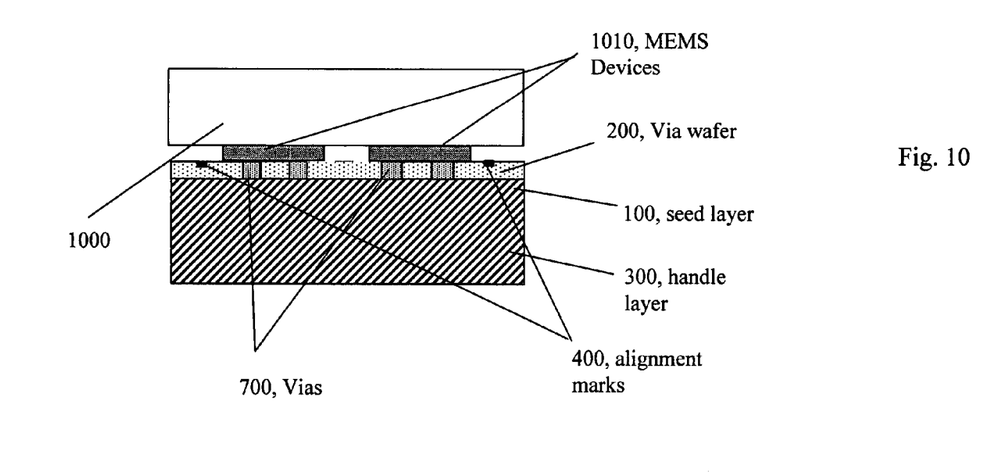
FIG. 10 is a cross sectional view of the exemplary substrate after assembly with a MEMS device wafer.

The wafer assembly 10 is now essentially complete, and may be combined with a third wafer 1000. In one embodiment, the third wafer 1000 may be a device wafer upon which one or more microdevices 1010 has previously been formed.

In one exemplary embodiment, the device wafer 1000 may support a plurality of MEMS devices 1010, which may be, for example, switches, emitters, accelerometers, or an assortment of such devices. An example of a MEMS device that may make use of this invention is a microfabricated electrical switch described in, for example, U.S. patent application Ser. No. 11/797,924 (IMT-V3), hereby incorporated by reference in its entirety. The wafer assembly 10 contains the features 700 needed to provide electrical access to the devices 1010. These features 700 may be used to provide power or signals to/from the devices 1010. The bonding between the feature wafer assembly 10 and the device wafer 1000 may accomplished using any convenient adhesive or bonding mechanism, such as epoxy, fusion bond, ionic bond, eutectic or metal alloy bond. If an evacuated cavity is required for proper functioning of the devices, the bond may be hermetic. A hermetic bond may be made by, for example, forming an alloy seal 400 as taught in greater detail in U.S. patent application Ser. No. 11/211,625, now U.S. Pat. No. 7,582,969) and U.S. patent application Ser. No. 11/304,601, now U.S. Pat. No. 7,569,926) incorporated by reference herein in their entireties. The alloy seal may be an alloy of gold (Au) layers and indium (In) layer, in the stoichiometry of $AuIn_2$. Alternatively, the adhesive may be $SiO_2$ which can join the silicon of the device wafer 1000 with the silicon of the feature wafer 200.

In another embodiment, the third wafer 1000 may simply be another support wafer of different material composition than support wafer 300. In yet another embodiment, the third wafer 1000 may be a fluidic wafer, wherein fluidic channels (not shown) may be etched.

Figure 11:
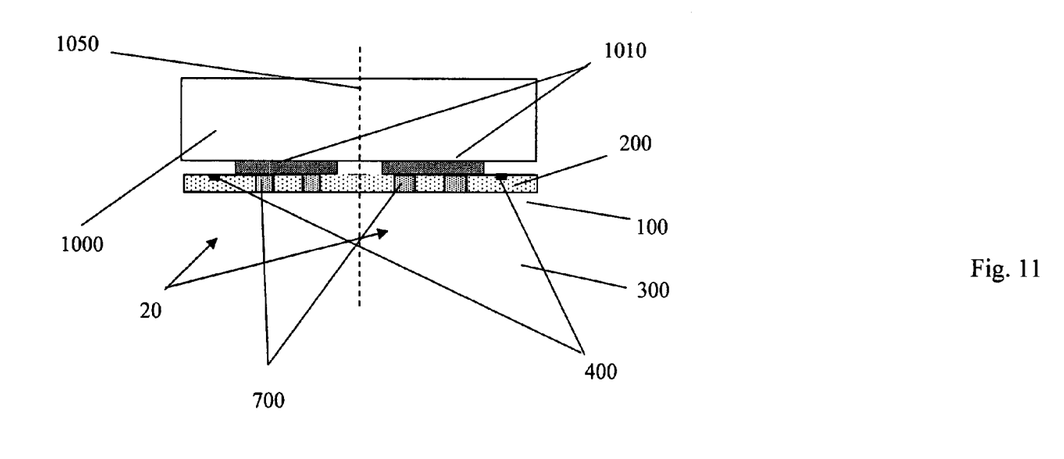
FIG. 11 is a cross sectional view of the exemplary substrate and MEMS device wafer after removal of the handle layer.

Finally, in FIG. 11, the second substrate 300 may be removed, as a handle layer is no longer needed and the thin feature wafer 200 is now supported by the third wafer 1000. At this point, the devices are essentially complete, and the individual devices 1010 may be separated one from another by dicing or sawing along the line 1050 to create the device assembly 20, shown in FIG. 11.

Accordingly, one of the distinguishing features of devices made according to this invention is the presence of a thin feature layer, in which a plurality of through wafer features has been formed, which is joined to a device wafer by an adhesive layer. In one embodiment, the adhesive layer is a thin layer of $SiO_2$ which joins a device wafer to the low-doped silicon feature wafer 200. As described above, the feature wafer 200 may be a thinned layer on the order of about 50 µm thick or even less, formed by etching or grinding the feature wafer 200 as described above. This thin 50 µm feature layer is not obvious, because if formed on a single 50 µm substrate, the thinness of the material would make it very difficult to handle in a cost-effective manner.

It should be understood that the thinned wafer may now include inlaid metal features which may be bonded to another wafer for additional support, and the handle wafer subsequently removed. This may be advantageous if the supporting wafers are required to have certain material, but different characteristics. In this case, the device wafer need not necessarily have devices formed thereupon, but may instead be needed only to provide additional support to the thinned wafer 200. Additional features, such as movable actuators, may then be formed directly in the thinned wafer 200. Additional features may also be formed in the support wafer, such as microfluidic channels to deliver fluids to the actuator formed in the thinned wafer 200.

Also because of the unique method for fabricating the features described above, the features may be particularly narrow and deep. That is, the features may have an aspect ratio (depth divided by width) of at least 3, and more generally about 10. Studies suggest that features with aspect ratios of up to 20 may be formed using this inventive method.

Finally, the use of a low resistivity feature wafer material with a resistivity of about 10 ohm-cm is not obvious because most feature wafers would be made using much higher resistivity materials, in order to provide good isolation between the features. In the present case as described above, some conductivity of the feature substrate is useful to perform the plating with the plating current running a short distance through the feature wafer material.

Figure 13:
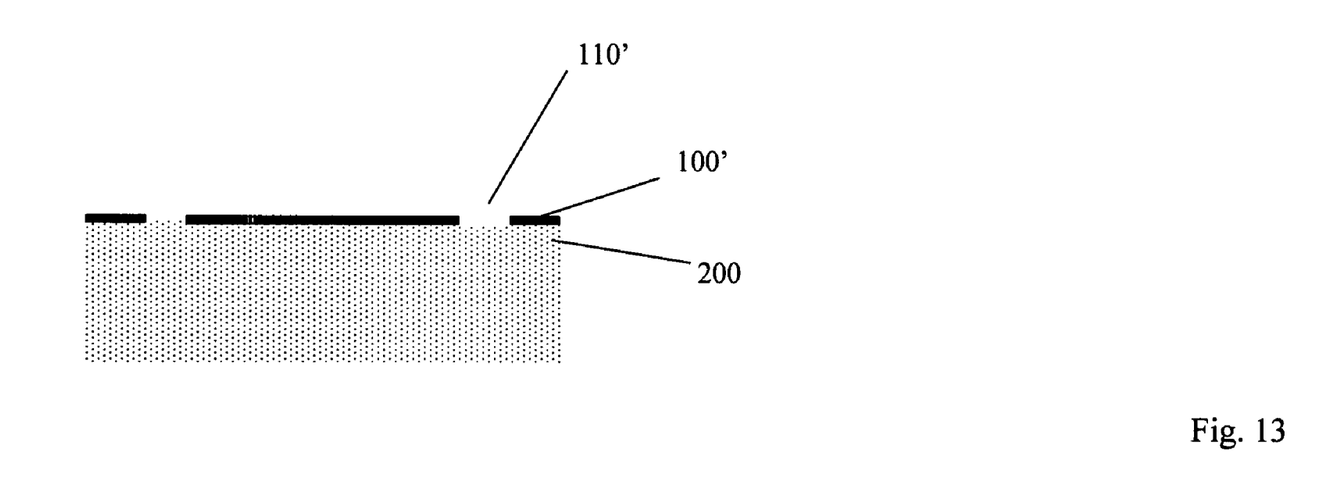
FIG. 13 is a cross sectional view of a second exemplary substrate according to a second step of the exemplary process.
Figure 14:
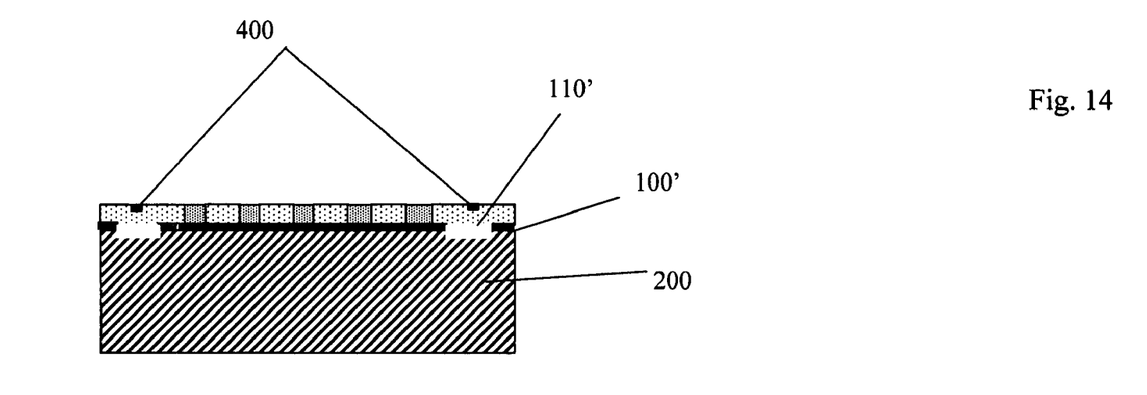
FIG. 14 is a cross sectional view of a second exemplary substrate after completion of the exemplary process.

Because of the unique features of the process described above, various additional features may be incorporated in the device that may be particularly convenient or advantageous. One such embodiment is described below, and illustrated in FIGS. 12-14. In particular, because the seed layer is deposited as described above, it may be made with certain advantageous features which may be patterned in the seed layer before the second substrate is attached. For example, windows or voids or other patterned features may be formed in the seed layer that allow viewing from below.

Figure 12:
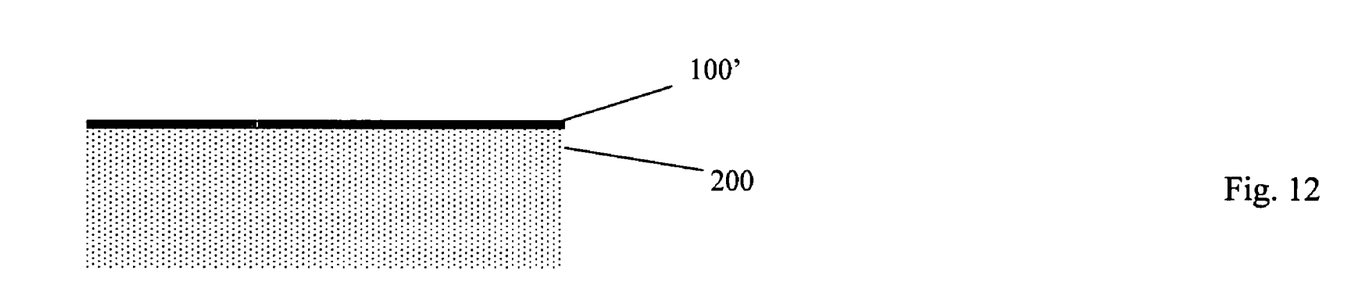
FIG. 12 is a cross sectional view of a second exemplary substrate according to a first step of an exemplary process.

FIG. 12 shows a first exemplary step in this embodiment. The first step of the process is identical to the first step that was shown in FIG. 2. A seed layer 100' is deposited over a first substrate 200. The first substrate 200 may first be coated with an adhesion layer, which may be, for example, titanium (Ti) or titanium-tungsten (TiW), which will promote adhesion of the seed layer to the first substrate 200. The seed layer 100' may then be deposited over the adhesion layer by, for example, sputter deposition. As before, in one embodiment, the seed layer 100' is a copper (Cu) layer. However, in this process, before depositing a bonding layer and bonding the second substrate, the seed layer 100' may be patterned with certain advantageous features. For example, one or more voids or windows 110' may be formed in the seed layer. Other features which may be formed at this point include the deposition of an additional material, such as dielectric material, a reflective or refractive optical materials or magnetic materials into the voids 110'. This deposition may be followed by a planarization of the deposited material, so that the top of the seed layer is substantially flat. The flatness is required for subsequent bonding of the seed layer and first substrate to the second substrate, as described above. After completion of the patterning of the seed layer, the first substrate 200 and seed layer 100' may be bonded to the second substrate 300, as was shown in FIG. 3.

Any of a number of other features may be created in the seed layer using this process. To create a surface structure that can be used in various ways in conjunction with the through-wafer plated features. In any case, these additional features may be formed either before or after the seed layer is deposited.

The process may then proceed as before as illustrated in FIGS. 3-11, which the deposition and patterning of alignment marks 400 and photoresist mask 500, etching of feature holes 600, plating of filler material into the feature holes, planarization, and bonding to a device wafer 1000. However, in this second embodiment, the alignment marks 400 may be viewable from below the wafer assembly 10' by an optical monitoring system 2000. The ability to see the alignment marks 400 from below through the second substrate 300 may assist in aligning the various masks during the process, or in correctly aligning the feature assembly 10' to the device wafer 1000.

Although not shown, it should be clear that the systems and processes described above may be combined with other known processes or known devices. For example, while features 700 are likely to have very small dimensions because of the scale of the microdevices 1010, the features 700 can be combined with large electrical pads which may be formed after removal of the handle wafer on the exterior (lower) surface of the device assembly 20. Such large pads may make connection of the device to external power supplies, signal processing equipment or the like, easier and cheaper by, for example, allowing wire bonding to the large pads provided.

The method described above may be used to fabricate through wafer features for any of a number of MEMS and integrated circuit devices. The through wafer features may be used to provide signals and voltages to signal or power supply inputs or outputs of the device. Because the features may be made with very high aspect ratios, this method may increase the efficiency of the usage of wafer area MEMS or semiconductor manufacturing. Because of the essentially perfect fill with which the features are made (no voids) the electrical and thermal characteristics of the devices may also be improved.

As mentioned above, it should be emphasized that the process described above may be used to create features other than vias. In fact, any inlaid, plateable structure may be made using the above-described techniques. Examples of such structures are various actuator structures such as described in U.S. patent application Ser. No. 11/260,367, now U.S. Pat. No. 7,229,838) and U.S. patent application Ser. No. 11/705,739, now U.S. Pat. No. 7,622,783, each of which is incorporated by reference in its entirety. The techniques described herein may be used to plate other metals, such as nickel-iron and iron-cobalt alloys. In these other embodiments, the wafer with the plated features may be coupled to another device wafer whereupon a plurality of microdevices is formed. In this case, the plated features may provide at least one of electrical access and motion to the plurality of microdevices. In particular, if the through feature is a magnetic material such as permalloy, the resulting device may be combined with an electromagnetic motor, and the through feature may interact with flux from the motor, causing motion of the microdevice.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes an embodiment including a MEMS switch, it should be understood that this embodiment is exemplary only, and that the systems and methods disclosed here may be applied to any number of alternative MEMS or non-MEMS devices.

Furthermore, while the process-has-been described in a number of steps performed in a certain order, it should be understood that this order is not essential to the performance of the method, except as specified. Additional steps may be added to the method without deviating from the spirit and scope of the invention. The specific details such as dimensions and fabrication methods-set forth above are examples and embodiments of the method. Accordingly, the exemplary implementations set forth above, are intended to be illustrative, not limiting.

What is claimed is:

1. A method for forming a conductive feature, comprising:
forming a seed layer over a first substrate;
bonding a second substrate to the seed layer;
forming a plurality of blind features in at least one of the first substrate and the second substrate, such that the blind features extend from the top of the first substrate or the second substrate to the seed layer;
depositing a conductive filler material into the blind features;
removing the substrate without the blind features to form through features that extend through the thickness of the first or the second substrate.

2. The method of claim 1, wherein the conductive filler material comprises at least one of a NiFe alloy, a CoFe alloy, and Cu.

3. The method of claim 2, further comprising:
forming a bonding layer over the seed layer, wherein the bonding layer adheres the second substrate to the seed layer.

4. The method of claim 1, wherein the conductive feature comprises a portion of an electromagnetic actuator.

5. The method of claim 1, wherein forming the seed layer comprises sputter depositing a layer of metal about 500 nm thick by sputter deposition, and wherein the conductive filler material is at least one of copper, gold, NiFe permalloy, iron and nickel.

6. The method of claim 1, wherein the conductive feature comprises at least one of an electrical feature and an actuator, wherein the electrical feature provides electrical access to a microdevice formed on a third substrate, and the actuator is capable of movement relative to the third substrate upon which the actuator is formed.

7. The method of claim 1, further comprising:
patterning at least one void in the seed layer, before bonding the second substrate to the seed layer.

8. The method of claim 1, further comprising:
forming an adhesion layer over the first substrate, before forming the seed layer, wherein the adhesion layer improves adhesion of the seed layer to the first substrate.

9. The method of claim 1, further comprising:
thinning the substrate with the blind holes to a thickness of about 50 □m, wherein the thinning is accomplished by at least one of etching and grinding.

10. The method of claim 2, further comprising bonding the first substrate to a device wafer, before removing the second substrate, wherein the device wafer supports a plurality of microdevices thereon.

11. The method of claim 10, wherein the bonding of the first substrate to the device wafer is performed so that the conductive filler material provides electrical access to devices on the device wafer.

12. The method of claim 7, further comprising:
depositing an additional material in the at least one void; and
planarizing the additional material so that a top surface of the seed layer is substantially flat.

13. The method of claim 12, wherein the additional material comprises at least one of an optical material, a magnetic material and a dielectric material.

* * * * *